US009653305B2

(12) United States Patent
Tegen et al.

(10) Patent No.: US 9,653,305 B2
(45) Date of Patent: May 16, 2017

(54) SEMICONDUCTOR COMPONENT WITH FIELD ELECTRODE BETWEEN ADJACENT SEMICONDUCTOR FINS AND METHOD FOR PRODUCING SUCH A SEMICONDUCTOR COMPONENT

(71) Applicant: Infineon Technologies Dresden GmbH, Dresden (DE)

(72) Inventors: Stefan Tegen, Dresden (DE); Marko Lemke, Dresden (DE); Rolf Weis, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 0 days.

(21) Appl. No.: 14/953,103

(22) Filed: Nov. 27, 2015

(65) Prior Publication Data

US 2016/0155809 A1    Jun. 2, 2016

(30) Foreign Application Priority Data

Nov. 28, 2014   (DE) .................. 10 2014 117 558

(51) Int. Cl.
| | |
|---|---|
| *H01L 21/283* | (2006.01) |
| *H01L 29/808* | (2006.01) |
| *H01L 29/78* | (2006.01) |
| *H01L 29/66* | (2006.01) |
| *H01L 29/40* | (2006.01) |

(Continued)

(52) U.S. Cl.
CPC ........ *H01L 21/283* (2013.01); *H01L 27/0883* (2013.01); *H01L 29/407* (2013.01); *H01L 29/42376* (2013.01); *H01L 29/66734* (2013.01); *H01L 29/66909* (2013.01);

(Continued)

(58) Field of Classification Search
CPC ............ H01L 29/8083; H01L 29/7813; H01L 29/66909; H01L 29/66734; H01L 27/0883; H01L 29/407; H01L 29/42376; H01L 21/283; H01L 29/045; H01L 21/823487
See application file for complete search history.

(56) References Cited

U.S. PATENT DOCUMENTS

2015/0279978 A1* 10/2015 Meiser ................ H01L 29/0657
                                                        257/586
2016/0293751 A1* 10/2016 Siemieniec ......... H01L 29/7811

FOREIGN PATENT DOCUMENTS

| DE | 10153315 A1 | 5/2003 |
|---|---|---|
| DE | 102005052734 A1 | 4/2007 |

* cited by examiner

*Primary Examiner* — Yasser A Abdelaziez
(74) *Attorney, Agent, or Firm* — Murphy, Bilak & Homiller, PLLC

(57) ABSTRACT

A semiconductor component includes semiconductor fins formed between a base plane and a main surface of a semiconductor body. Each semiconductor fin includes a source region formed between the main surface and a channel/body region, and a drift zone formed between the channel/body region and the base plane. The semiconductor component further includes gate electrode structures on two mutually opposite sides of each channel/body region, and a field electrode structure between mutually adjacent ones of the semiconductor fins. Each field electrode structure is separated from the drift zone by a field dielectric and extends from the main surface as far as the base plane. The gate electrode structures assigned to the mutually adjacent semiconductor fins enclose an upper portion of the corresponding field electrode structure from two sides.

10 Claims, 15 Drawing Sheets

(51) Int. Cl.
*H01L 29/423* (2006.01)
*H01L 27/088* (2006.01)
*H01L 29/04* (2006.01)
*H01L 21/8234* (2006.01)

(52) U.S. Cl.
CPC ...... *H01L 29/7813* (2013.01); *H01L 29/8083* (2013.01); *H01L 21/823487* (2013.01); *H01L 29/045* (2013.01)

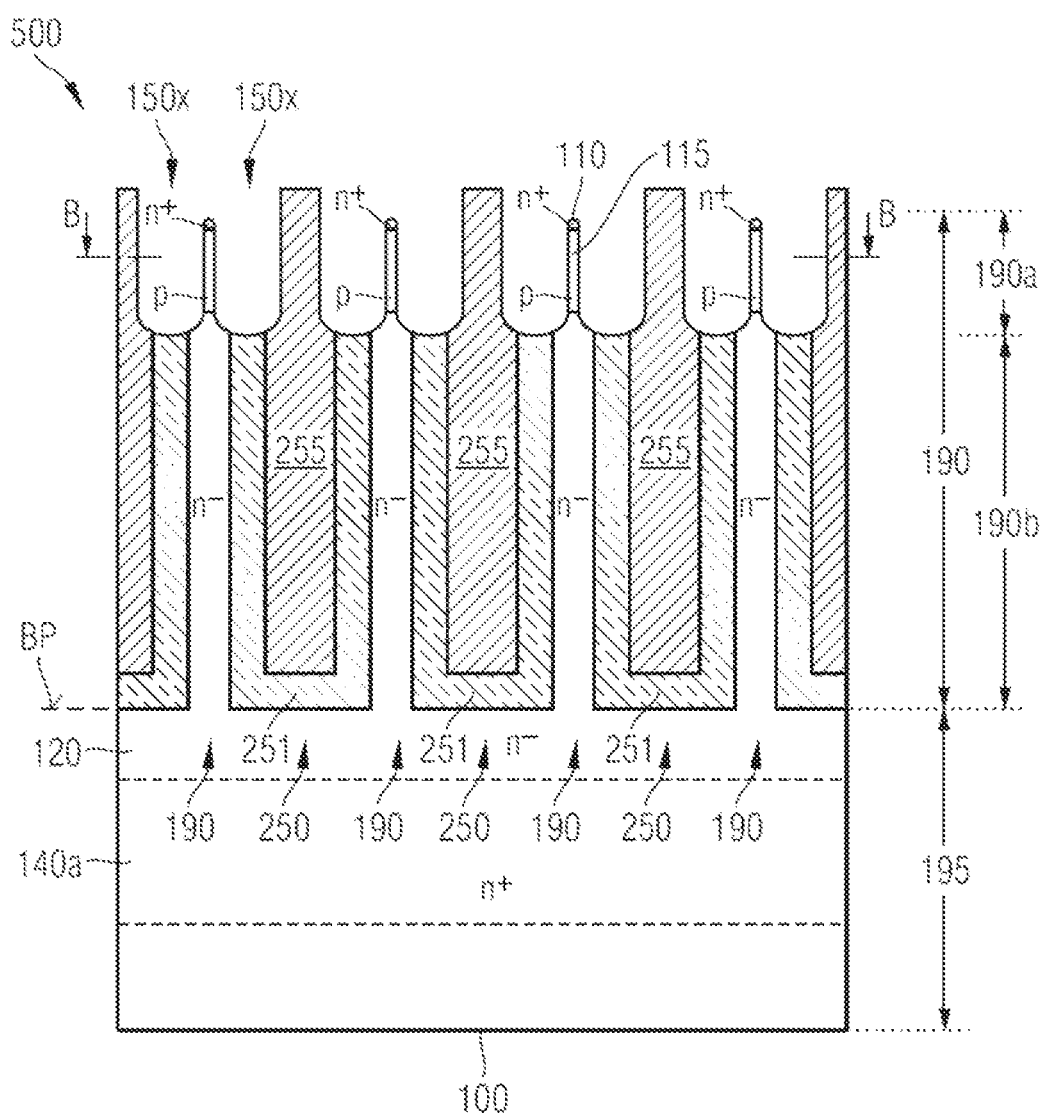

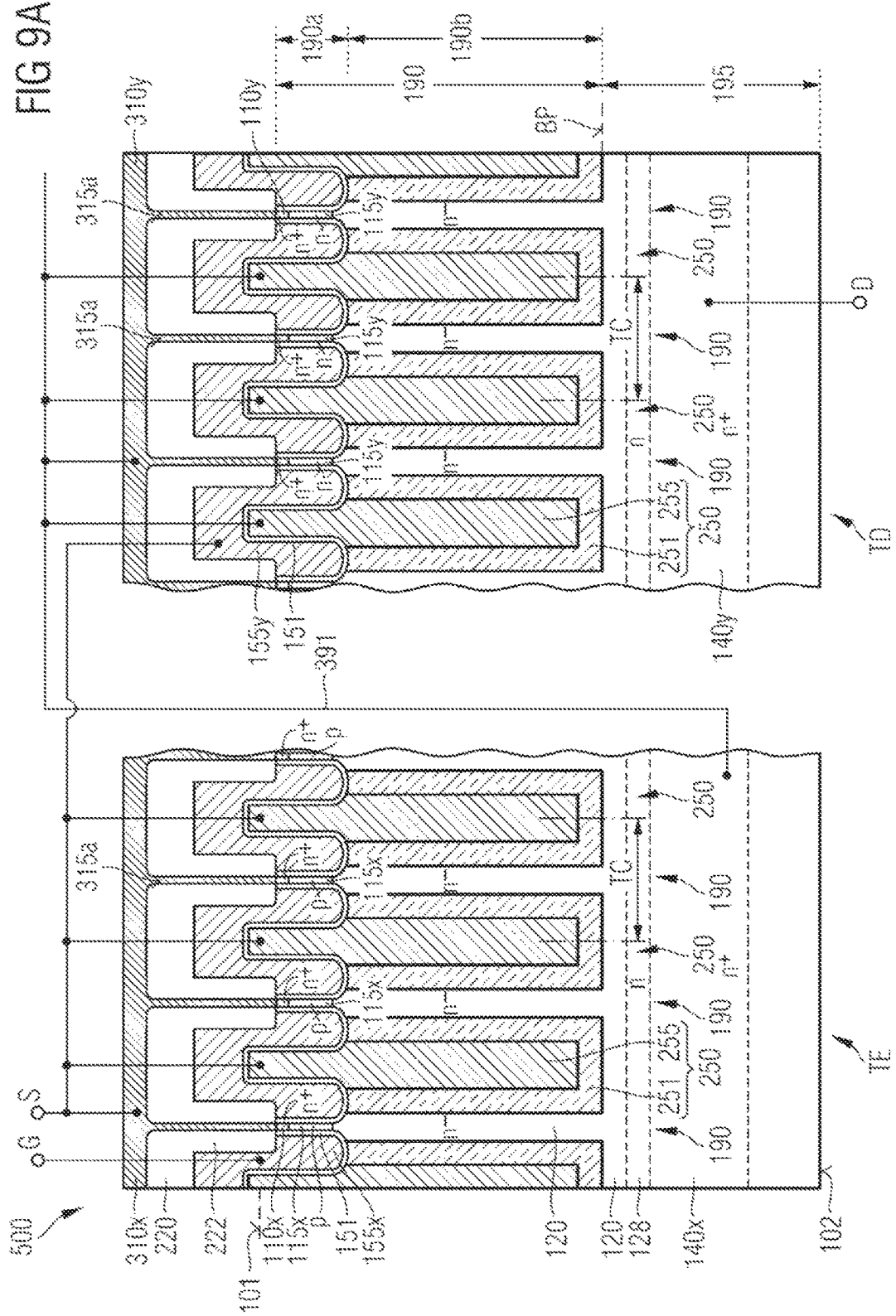

SEMICONDUCTOR COMPONENT WITH FIELD ELECTRODE BETWEEN ADJACENT SEMICONDUCTOR FINS AND METHOD FOR PRODUCING SUCH A SEMICONDUCTOR COMPONENT

PRIORITY CLAIM

This application claims priority to German Patent Application No. 10 2014 117 558.1 filed on 28 Nov. 2014, the content of said application incorporated herein by reference in its entirety.

TECHNICAL FIELD

The application relates to semiconductor components, for example power semiconductor switches, having a field electrode, and to a method for producing them.

BACKGROUND

Integrated power components having a drift zone between a voltage-controlled channel/body region and a drain region take up reverse voltages that are all the higher, the longer the drift zone is, wherein as the length of the drift zone increases, the on resistance RDSon of the power component also increases. In power components having field electrodes adjoining the drift zone, in off-state operation mobile charge carriers are depleted from the portions of the drift zone that lie between the field electrodes, and a potential applied to the field electrodes compensates for the remaining charge of the stationary dopant ions in the depleted drift zone. The compensation of the electric field in the drift zone allows a higher basic doping of the drift zone, as a result of which a lower on resistance RDSon and lower power losses are obtained for the same length of the drift zone. It is desirable for the switching properties of semiconductor components having a field electrode to be improved.

SUMMARY

One embodiment relates to a semiconductor component comprising semiconductor fins formed between a base plane and a main surface of a semiconductor body. Each semiconductor fine comprises a source region formed between the main surface and a channel/body region, and a drift zone formed between the channel/body region and the base plane. The semiconductor component further comprises gate electrode structures on two mutually opposite sides of each channel/body region, and a field electrode structure between mutually adjacent ones of the semiconductor fins. Each field electrode structure is separated from the drift zone by a field dielectric and extends from the main surface as far as the base plane. The gate electrode structures assigned to the mutually adjacent semiconductor fins enclose an upper portion of the corresponding field electrode structure from two sides.

According to a further embodiment, a method for producing a semiconductor component comprises etching trenches into a semiconductor layer proceeding from a main surface as far as a base plane, wherein semiconductor fins are formed between the trenches. The trenches are lined with a dielectric layer. Field electrodes are formed in the trenches lined with the dielectric layer. Upper portions of the dielectric layer are removed, wherein gate trenches are formed between the semiconductor fins and the field electrodes, the gate trenches exposing upper portions of the semiconductor fins that adjoin the main surface. Gate electrodes are formed in the gate trenches.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 6A shows a schematic vertical cross section of the semiconductor substrate portion from FIG. 5 after the process of thinning semiconductor fins between gate trenches produced by the process of removing the upper portions of the dielectric layer.

FIG. 9A shows a schematic vertical cross section of a portion of an ADZFET (active drift zone FET) in accordance with a further embodiment.

DETAILED DESCRIPTION

Figure 1A:
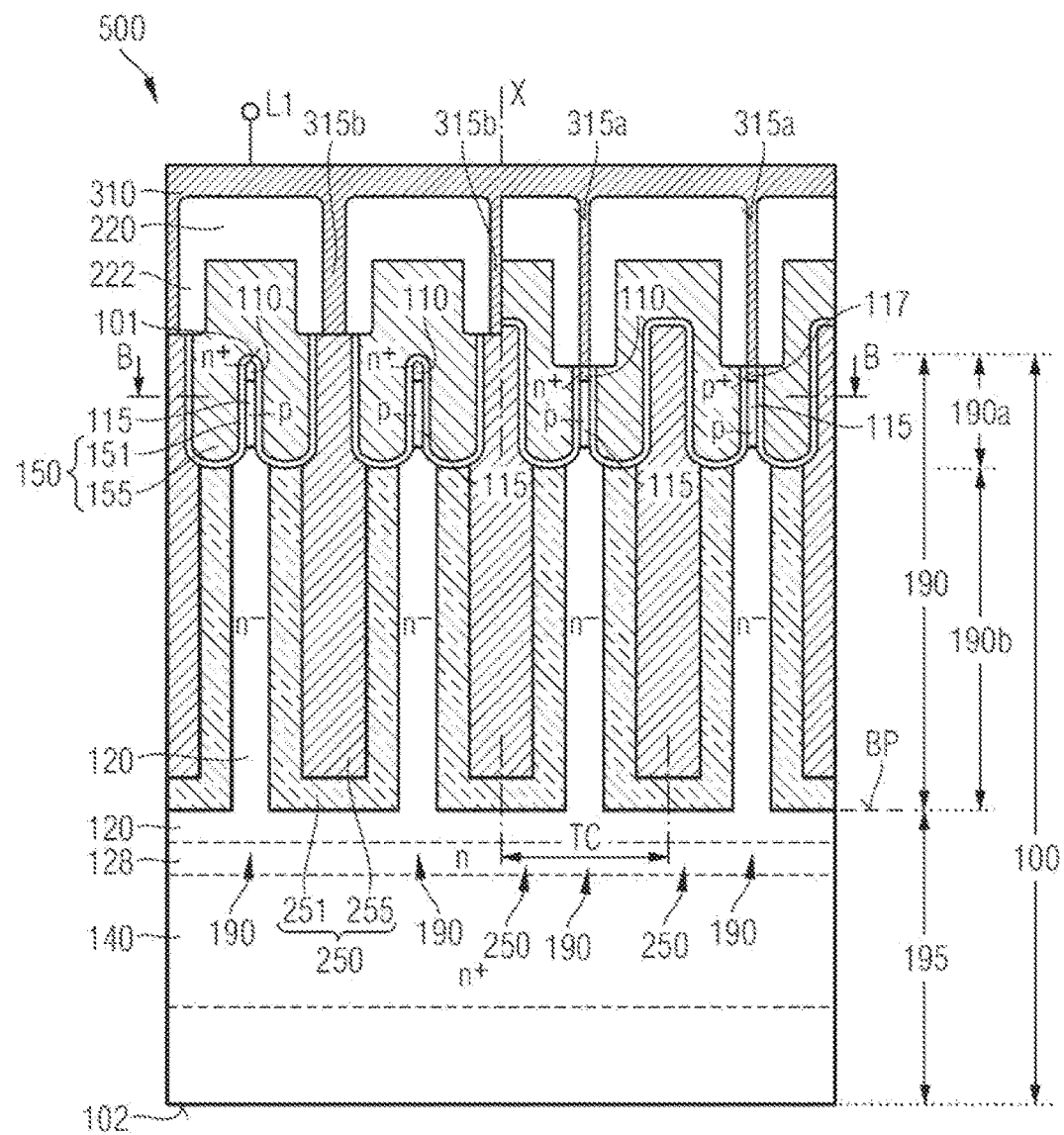
FIG. 1A shows a schematic vertical cross section perpendicular to a main surface through a portion of a semiconductor component in accordance with one embodiment.

Some exemplary embodiments are explained in greater detail below with reference to the figures. However, the invention is not restricted to the embodiments described, but rather can be suitably modified and amended. Individual features and feature combinations of one embodiment can be suitably combined with features and feature combinations of other embodiments, provided that the relevant features are not mutually exclusive. Corresponding elements are provided with corresponding or similar reference signs in the figures and a repeated description of such elements is dispensed with in part. Moreover, the figures are not necessarily illustrated in a manner true to scale since they serve principally for illustration and elucidation.

Hereinafter the term "electrically connected" describes a low-impedance connection between the elements electrically connected to one another, for example a direct contact between the relevant elements or a low-impedance connection via a metal and/or a highly doped semiconductor. The term "electrically coupled" includes the provision of one or a plurality of active and/or passive electrical elements suitable for forwarding signals in a conduction path between the electrically coupled elements, for example such elements which bring about a low-impedance connection in a first state and a high-impedance decoupling of the electrically coupled elements in a second state.

The accompanying figures indicate relative dopant concentrations. By way of example, "n$^-$" denotes a region having a dopant concentration which is lower than the dopant concentration in a region designated by "n". The designation "n$^+$" indicates a region in which the dopant concentration is higher than in a region designated by "n". Regions having the same relative dopant concentration need not necessarily have the same absolute dopant concentration. By way of example, two regions designated equally by "n" can have the same or different dopant concentrations.

FIGS. 1A to 1D relate to a semiconductor component having transistor cells TC, which can be JFET (junction field effect transistor) cells or IGFET (insulated gate field effect transistor) cells, for example enhancement-mode or depletion-mode MOSFET (metal oxide semiconductor field effect transistor) cells, wherein the abbreviation MOSFET encompasses both FETs (field effect transistors) having metallic gate electrodes and FETs having nonmetallic electrodes. Accordingly, the semiconductor component 500 is a JFET, an IGFET, an ADZFET or a component which, alongside the corresponding transistor cell type, comprises even further circuits, for example a gate driver or a control logic circuit.

The semiconductor component 500 comprises a semiconductor body 100 having a main surface 101 on the component front side and a rear-side surface 102 situated opposite the main surface 101 on the rear side of the component. Hereinafter, lateral directions and extents are those parallel to the main surface 101 and vertical directions and extents are those perpendicular to the main surface 101.

The material of the semiconductor body 100 is monocrystalline semiconductor material, for example silicon Si, silicon carbide SiC, germanium Ge, a silicon-germanium crystal SiGe, gallium nitride GaN or gallium arsenide GaAs. The thickness of the semiconductor body 100 between the main surface 101 and the rear-side surface 102 is at least 20 µm, for example at least 90 µm. The semiconductor body 100 can have a rectangular contour having an edge length of a plurality of millimeters. On the component front side of the semiconductor body 100, portions of the semiconductor body 100 form semiconductor fins 190 which extend between the main surface 101 and a base plane BP and are separated from one another by field electrode structures 250 in one or both lateral directions.

The semiconductor fins 190 can in each case have the same fin width, which can be in the range of 10 nm to 500 nm. The width of the field electrode structures 250 corresponds to the distance between the semiconductor fins 190 and can be in the range of 30 nm to 500 nm inclusive. The pitch (distance from center axis to center axis) of adjacent semiconductor fins can be in a range of 40 nm to approximately 1 µm.

In accordance with one embodiment, the semiconductor fins 190 are strips arranged at regular distances and having the same fin width in each case. According to another embodiment, the semiconductor component 500 comprises first semiconductor fins 191, which run along a first lateral direction, and second semiconductor fins 192, which run along a second lateral direction intersecting the first lateral direction.

In the semiconductor fins 190, source regions 110 are formed in a manner adjoining the main surface 101, channel/body regions 115 are formed in a manner adjoining the source regions 110 and separated from the main surface 101 by the source regions 110, and at least portions of a drift zone 120 are formed between the channel/body regions 115 and the base plane BP.

The source regions 110 and the drift zone 120 are of the same, first conductivity type. The channel/body regions 115 can be of the same first conductivity type or of a second conductivity type complementary to the first conductivity type.

The embodiments depicted relate to enhancement-mode re-channel FET transistor cells having n-doped source regions 110, an n-doped drift zone 120 and p-doped channel/body regions 115. In accordance with one embodiment relating to depletion-mode n-channel FETs, the channel/body regions 115 are n-doped. For p-channel FET transistor cells, the first conductivity type is the p-type.

Upper portions 190a of the semiconductor fins 190 that adjoin the main surface 101 comprise at least the source regions 110 and the channel/body regions 115 and can have a smaller lateral width than lower portions 190b formed between the upper portions 190a and the base plane BP, at least portions of the drift zone 120 being formed in said lower portions.

At least in the upper portions 190a between the main surface 101 and the lower portions 190b, according to one embodiment, the sidewalls of the semiconductor fins 190 are (111) crystal faces produced from a crystallographic etch, for example by means of a TMAH (tetramethylammonium hydroxide) solution, a KOH (potassium hydroxide) solution or an EDP (ethylenediamine pyrocatechol) solution.

The field electrode structures 250 arranged between the lower portions 190b of the semiconductor fins 190 in each case comprise a field dielectric 251 and a field electrode 255, wherein the field dielectric 251 electrically insulates the field electrode 255 from the semiconductor material of the semiconductor fins 190 and a continuous portion 195 of the semiconductor body 100 between the base plane BP and the rear-side surface 102. The field dielectric 251 consists of or contains a semiconductor oxide, for example silicon oxide, for example thermally grown silicon oxide or deposited silicon oxide, a semiconductor nitride, for example silicon nitride, or a semiconductor oxynitride, for example silicon oxynitride.

The field electrode 255 consists of or contains highly doped polycrystalline silicon, a metal-semiconductor compound, for example a silicide, and/or a metal, a metal alloy or a metal nitride.

First portions of a gate electrode structure 150 are arranged on the two opposite sides of the upper portion 190a of a semiconductor fin 190, wherein first portions of the gate electrode structure 150 that are assigned to adjacent semiconductor fins 190 enclose an upper portion of a field electrode 255 arranged between the adjacent semiconductor fins 190.

The gate electrode structure 150 comprises a gate electrode 155 and, for transistor cells TC of the IGFET type, can comprise a gate dielectric 151 formed at least along the upper portions 190a of the semiconductor fins 190. For transistor cells TC of the JFET type, a gate dielectric is absent and the gate electrode 155 directly adjoins the upper portion 190a of the respective semiconductor fin 190.

The gate dielectrics 151 consist of or comprise a semiconductor oxide, for example thermal or deposited silicon oxide, a semiconductor nitride, for example silicon nitride, or a semiconductor oxynitride, for example silicon oxynitride.

The gate electrode 155 consists of or contains highly doped polycrystalline silicon, a metal-semiconductor compound, for example a silicide, a metal, a metal nitride, for example TaN or TiN, and/or a metal alloy.

A dielectric structure 220 separates a first load electrode 310, for example the source electrode of n-channel FET transistor cells TC, from the gate electrode 155, which comprises a continuous second portion above the semiconductor fins 190. First contact structures 315a extend from the first load electrode 310 through openings in the dielectric structure 220 as far as or into the upper portions 190a of the semiconductor fins 190. The first contact structures 315a are separated from one another along the semiconductor fins 190 and can extend at least partly as far as at least the transition between the source region 110 and the channel/body region 115 of the relevant semiconductor fin 190. In accordance with one embodiment, the source regions 110 alternate along at least one lateral direction, for example in the sectional plane and/or perpendicular to the sectional plane, with highly doped contact zones 117 for the channel/body regions 115, such that the first contact structures 315a connect both the source and the channel/body regions 110, 115.

Second contact structures 315b can connect the field electrodes 255 to the first load electrode 310, for example, through further openings in the dielectric structure 220. Dielectric spacers 222 extend along vertical sidewalls of the first and second contact structures 315a, 315b and insulate the latter from the gate electrode 155.

The dielectric structure 220 comprises one or a plurality of layers composed of dielectric material, for example composed of thermally grown semiconductor oxide, for instance thermal silicon oxide, deposited silicon oxide, for example silicon oxide deposited using tetraethyl orthosilicate as a precursor stage, or silicon glass, for example PSG (phosphosilicate glass), BSG (borosilicate glass) or BPSG (borophosphosilicate glass), a semiconductor nitride, for example silicon nitride, or a semiconductor oxynitride, for example silicon oxynitride.

The first load electrode 310 can form a first load terminal L1 of the semiconductor component 500 or is electrically connected to a first load terminal L1.

The continuous portion 195 of the semiconductor body 100 below the semiconductor fins 190 can have a connected drift zone portion adjoining the base plane BP. In accordance with one embodiment, a field stop zone 128 is formed in the region of the continuous portion 195, the dopant concentration of said field stop zone exceeding the dopant concentration in the drift zone 120 at least 10-fold.

Between the base plane BP and the rear-side surface 102, furthermore, a highly doped connection layer 140 is formed in the vertical projection of the semiconductor fins 190 and the field electrode structures 250. The highly doped connection layer 140 having a dopant concentration of at least 1E18 cm$^{-3}$ in the case of a silicon semiconductor layer 100a first acts as a drain region of the transistor cells TC and secondly conducts away the drain current into a region of the semiconductor body 100 outside a cell array having the transistor cells TC. The connection layer 140 can be electrically connected via a sinker structure to a second load electrode on the front side of the component or to a further connection structure to a further cell array, wherein the second load electrode can form a second load terminal of the semiconductor component 500 or can be electrically connected to such a second load terminal.

The material of the load electrodes is in each case aluminum Al, copper Cu, or an alloy comprising aluminum and copper AlCu with or without further admixtures, for example silicon. In addition, the two load electrodes can comprise further conductive auxiliary and intermediate layers.

The transistor cells TC are basically FinFETs having very short switch-off times with high current-carrying capacity. Unlike in the production of transistor cells having channel/body regions 115 buried deep in the semiconductor body, which comprises a plurality of critical processes in trenches having a high aspect ratio between comparatively narrow semiconductor fins, in the production of the semiconductor component 500 deep trenches can largely be refilled as a early as in the processes directly following the trench etch and the intervening narrow semiconductor fins 190 can thus be stabilized. The risk of collapsing semiconductor fins 190 during manufacture is significantly reduced and the yield of functional semiconductor components 500 is thus improved.

Compared with concepts in which source regions, on the one hand, and drain regions, on the other hand, are formed in different semiconductor fins or in different lateral portions of the same semiconductor fin, the purely vertical concept of the semiconductor component 500 increases the proportion of the available lateral semiconductor area that is constituted by the overall drift zone cross section. Thus, for the same load current, the area-specific loading of the semiconductor component 500 is reduced, or the area efficiency is increased.

Figure 1B:
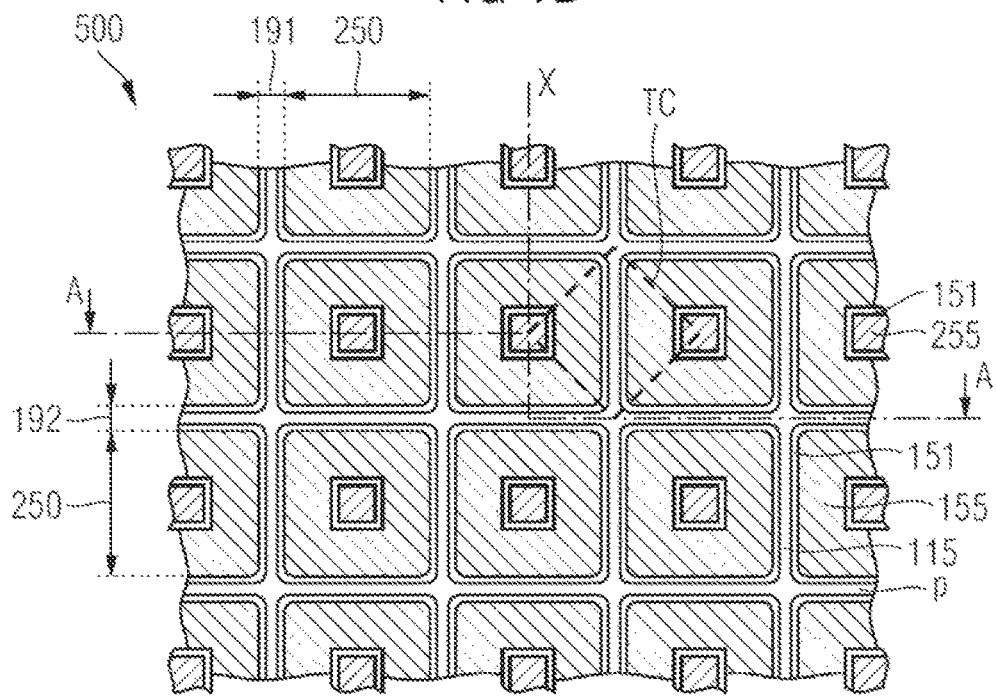
FIG. 1B shows a schematic lateral cross section through the portion of the semiconductor component from FIG. 1A along the sectional line B-B parallel to the main surface.

In accordance with the embodiment depicted in FIG. 1B, the semiconductor component 500 comprises first semiconductor fins 191, which extend along a first lateral direction, and second semiconductor fins 192, which extend along a second lateral direction intersecting the first lateral direction. In the exemplary embodiment depicted, the two lateral directions run perpendicularly to one another. The semiconductor fins 191, 192 form a network having rectangular, for example approximately square, meshes which can be arranged in regular rows and columns. The field electrodes 255 are field needles having approximately rectangular, for example square, lateral cross-sectional areas. At the fin node, in each case four semiconductor fins 191, 192 are connected to one another.

Figure 1C:
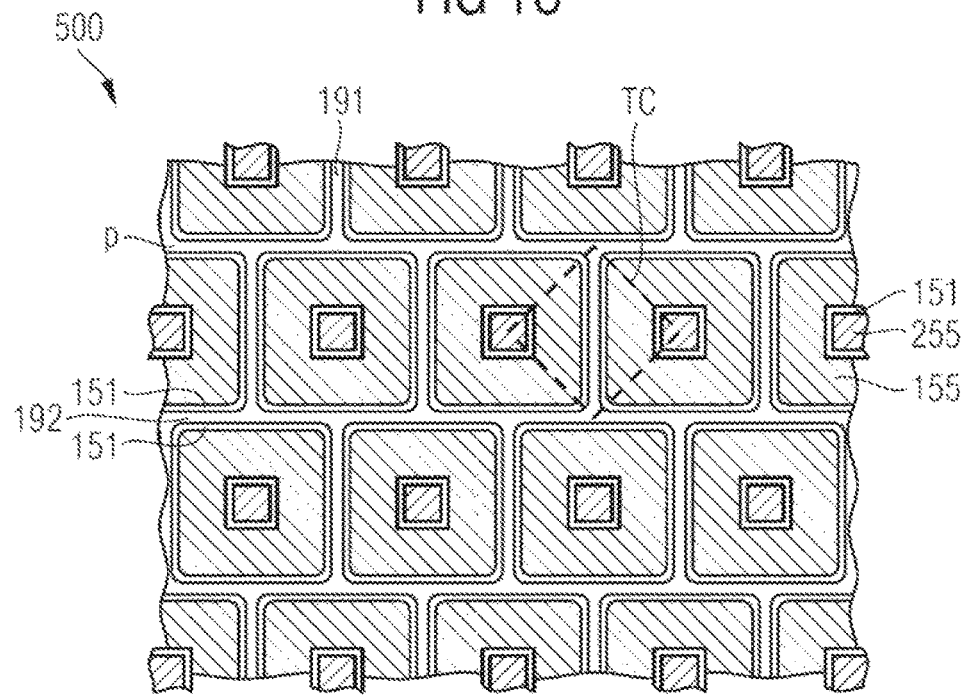
FIG. 1C shows a schematic lateral cross section of a semiconductor component in accordance with one embodiment having field electrodes offset relative to one another line by line.

FIG. 1C relates to an embodiment having field needles which are arranged in the meshes of a network having mesh rows offset relative to one another row by row. The fin nodes connect in each case three semiconductor fins 191, 192. The cruciform fin nodes from FIG. 1B are replaced by T fin nodes.

Figure 1D:
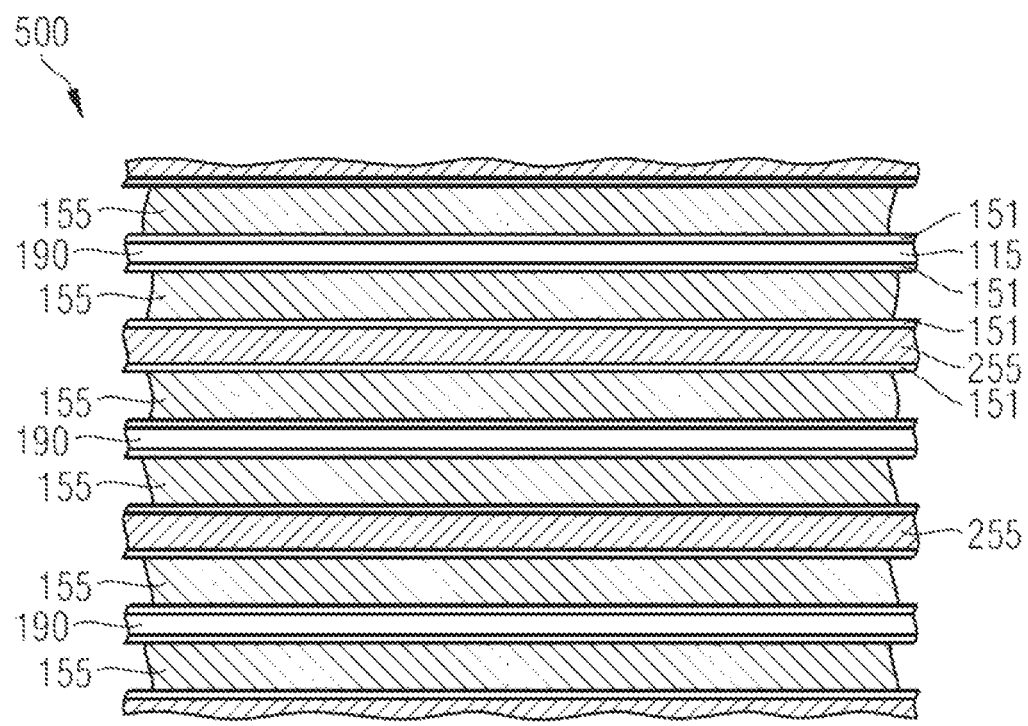
FIG. 1D shows a schematic lateral cross section through a semiconductor component in accordance with one embodiment having semiconductor fins arranged in a strip-like fashion.

In the embodiment in FIG. 1D, all the semiconductor fins 190 run parallel to one another in the same lateral direction.

FIGS. 2 to 8B relate to the production of the above-described semiconductor component 500 from a semiconductor substrate 500a.

The semiconductor substrate 500a consists of or comprises a semiconductor layer 100a composed of a monocrystalline semiconductor material, for example silicon Si, silicon carbide SiC, germanium Ge, a silicon-germanium crystal SiGe, gallium nitride GaN or gallium arsenide GaAs. In accordance with one embodiment, the semiconductor substrate 500a is a silicon wafer. In accordance with another embodiment, the semiconductor substrate 500a is an SOI (silicon-on-insulator) wafer, for example an SOG (silicon-on-glass) wafer, in which the semiconductor layer 100a is provided on an insulator substrate. The semiconductor layer 100a may have emerged for example at least partly from an epitaxy process and can comprise one or a plurality of partial layers which deviate from one another with regard to the dopant concentration, the conductivity type or both. Outside the illustrated region, the semiconductor substrate 500a can comprise further semiconducting and/or dielectric structures in addition to the semiconductor layer 100a.

The semiconductor layer 100a has on a front side a planar first surface 101a, opposite which there is a second surface 102a on the rear side of the semiconductor substrate 500a. Directions parallel to the first surface 101a are lateral directions and the normal to the first surface 101a predefines a vertical orientation.

A highly doped, buried layer 140a is formed in the semiconductor layer 100a. By way of example, the buried layer 140a is formed by in-situ doping of a layer growing epitaxially on a base substrate. In accordance with other embodiments, the buried layer 140a emerges from the introduction, for example the implantation, of dopants into the semiconductor layer 100a through the first or the second surface 101a, 102a. Portions of the semiconductor layer 100a between the first surface 101a and the buried layer 140a can have a weak doping of the first conductivity type, e.g. of the n-type.

From the front side, trenches 250x are introduced into the semiconductor layer 100a from the first surface 101a as far as a base plane BP, for example by means of a dry etch using a hard mask patterned by photolithograpy on the first surface 101a. The introduction of the trenches 250x can furthermore comprise an anisotropic, crystal-direction-dependent wet-chemical etch by which at least portions of vertical sidewalls of the semiconductor fins 190 formed between the trenches 250x are formed in an almost perfectly planar fashion. After the trenches 250x have been formed, the hard mask can be removed.

Figure 2:
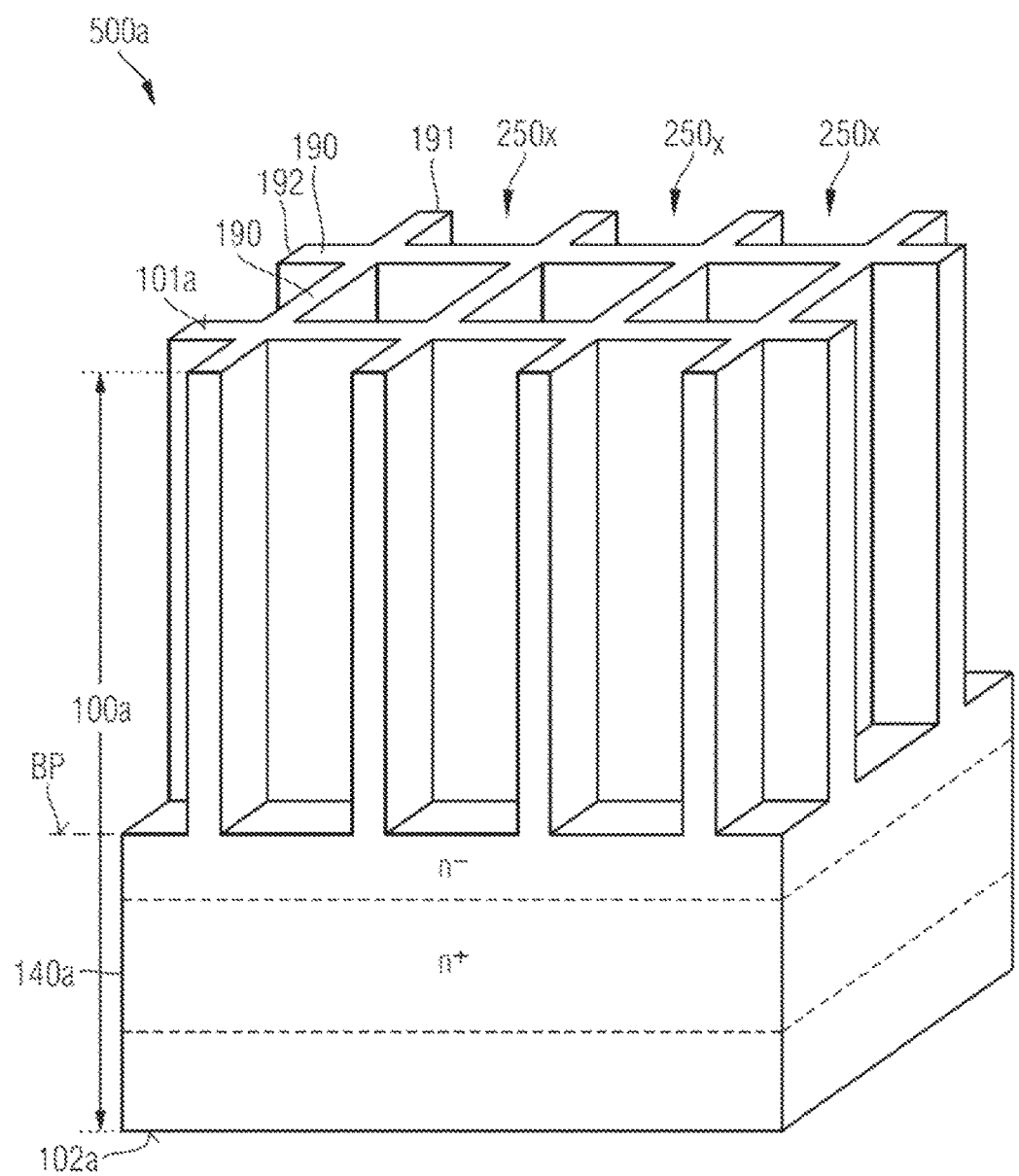
FIG. 2 shows a schematic perspective illustration of a portion of a semiconductor substrate for illustrating a method for producing a semiconductor component in accordance with one embodiment after the process of etching trenches.

FIG. 2 shows the semiconductor substrate 500a with the buried layer 140 and the semiconductor fins 190 separated from one another by the trenches 250x between the first surface 101a and the base plane BP. The base plane BP can run between the first surface 101a and the buried layer 140a or within the buried layer 140a.

The semiconductor fins 190 can be arranged in parallel strips. In accordance with the embodiment illustrated, first semiconductor fins 191 run along a first lateral direction and second semiconductor fins 192 run in a second lateral direction orthogonal to the first lateral direction.

On the front side, a dielectric layer 251a is produced on the semiconductor substrate 500a, said dielectric layer covering the relief formed by the semiconductor fins 190 and trenches 250x with an approximately identical layer thickness. The production of the dielectric layer 251a can comprise a thermal oxidation of the semiconductor material of the semiconductor layer 100a and/or the deposition of one or a plurality of dielectric materials. By way of example, forming the dielectric layer 251a comprises depositing silicon dioxide using TEOS.

Figure 3:
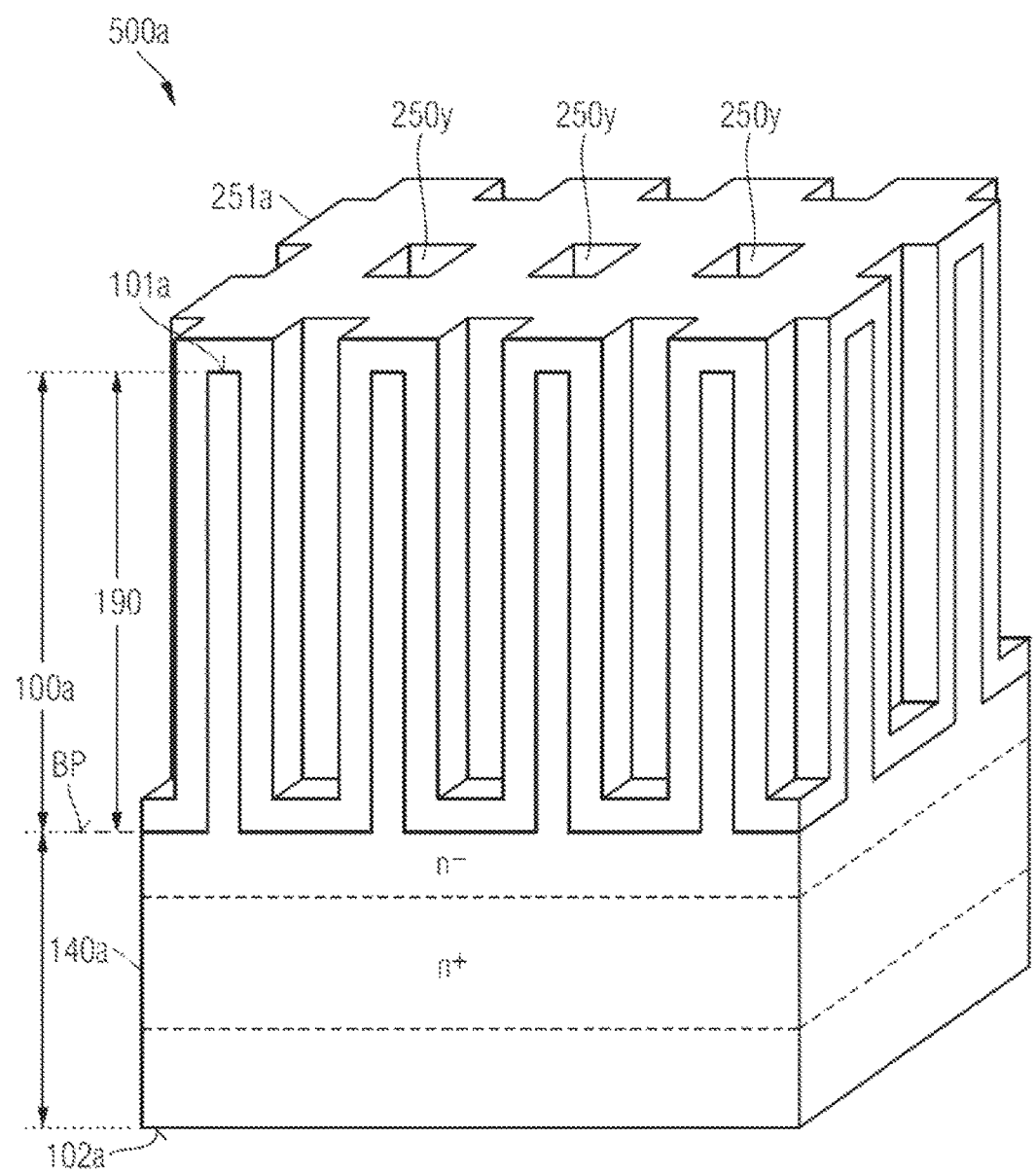
FIG. 3 shows a schematic perspective illustration of the semiconductor substrate portion from FIG. 2 after the process of lining the trenches with a dielectric layer.

FIG. 3 shows the dielectric layer 251a, which covers the semiconductor fins 190 with uniform thickness or lines the trenches 250y with uniform layer thickness. The layer thickness of the dielectric layer 251a can be between 50 nm and 300 nm, for example between 80 nm and 150 nm.

The lined trenches 250y are filled with a conductive material. By way of example, one layer composed of a conductive material is deposited or a plurality of layers composed of different conductive materials are deposited, the lined trenches 250y being filled. Afterward, conductive material that was deposited outside the lined trenches 250y is drawn back at least as far as the upper edge of the dielectric layer 251a.

In accordance with one embodiment, filling the lined trenches 250y comprises depositing heavily n-doped polycrystalline silicon, which is etched back in a dry-etching step with an end point on the material of the dielectric layer 251a.

Figure 4:
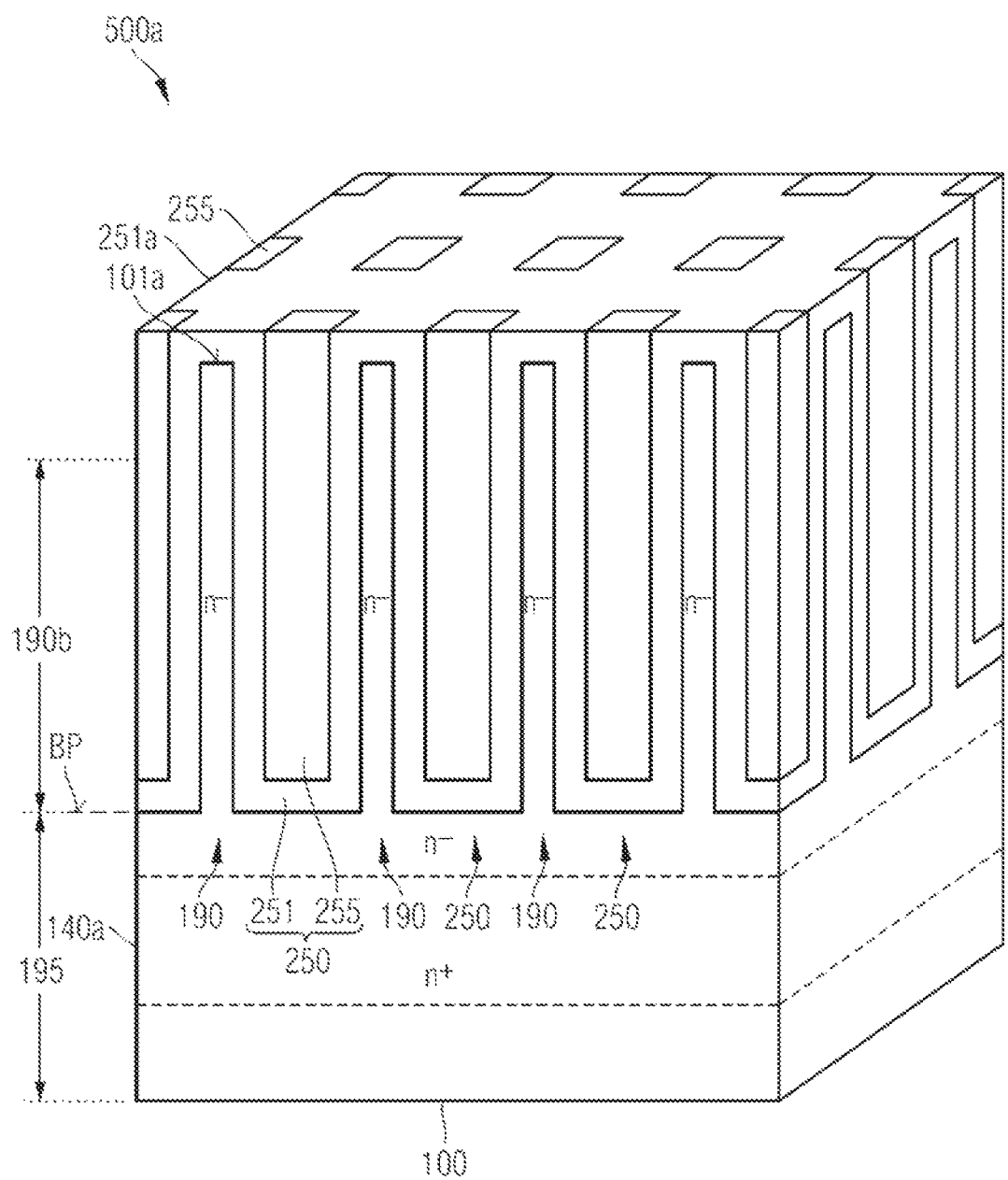
FIG. 4 shows a schematic perspective illustration of the semiconductor substrate portion from FIG. 3 after the process of filling the lined trenches with a field electrode.

FIG. 4 shows, between lower portions 190b of the semiconductor fins 190, field electrode structures 250 having field dielectrics 251 formed from portions of the dielectric layer 251a and field electrodes 255 formed from portions of the deposited conductive materials. The conductive material is drawn back as far as the upper edge of the dielectric layer 251a.

Upper portions of the dielectric layer 251a between upper portions 190a of the semiconductor fins 190 are removed, for example by means of a dry- or wet-chemical etching-back.

Before the removal, after the removal of part above the first surface 101a, after the complete removal of the upper portions of the dielectric layer 251a or earlier, for example before the introduction of the trenches 250x, dopants are introduced into upper portions 190a of the semiconductor fins 190 from the front side. The introduction of the dopants comprises, in a first doping process, the introduction of dopants of the first conductivity type near the first surface 101a and can comprise, in a second doping process, the introduction of dopants of a second conductivity type with a concentration maximum between the base plane BP and the concentration maximum of the dopants introduced near the surface 101a in the first doping process. By way of example, the dopants are implanted with different implantation energies in the first and second doping processes. The first doping process can proceed or succeed the second doping process.

Figure 5:
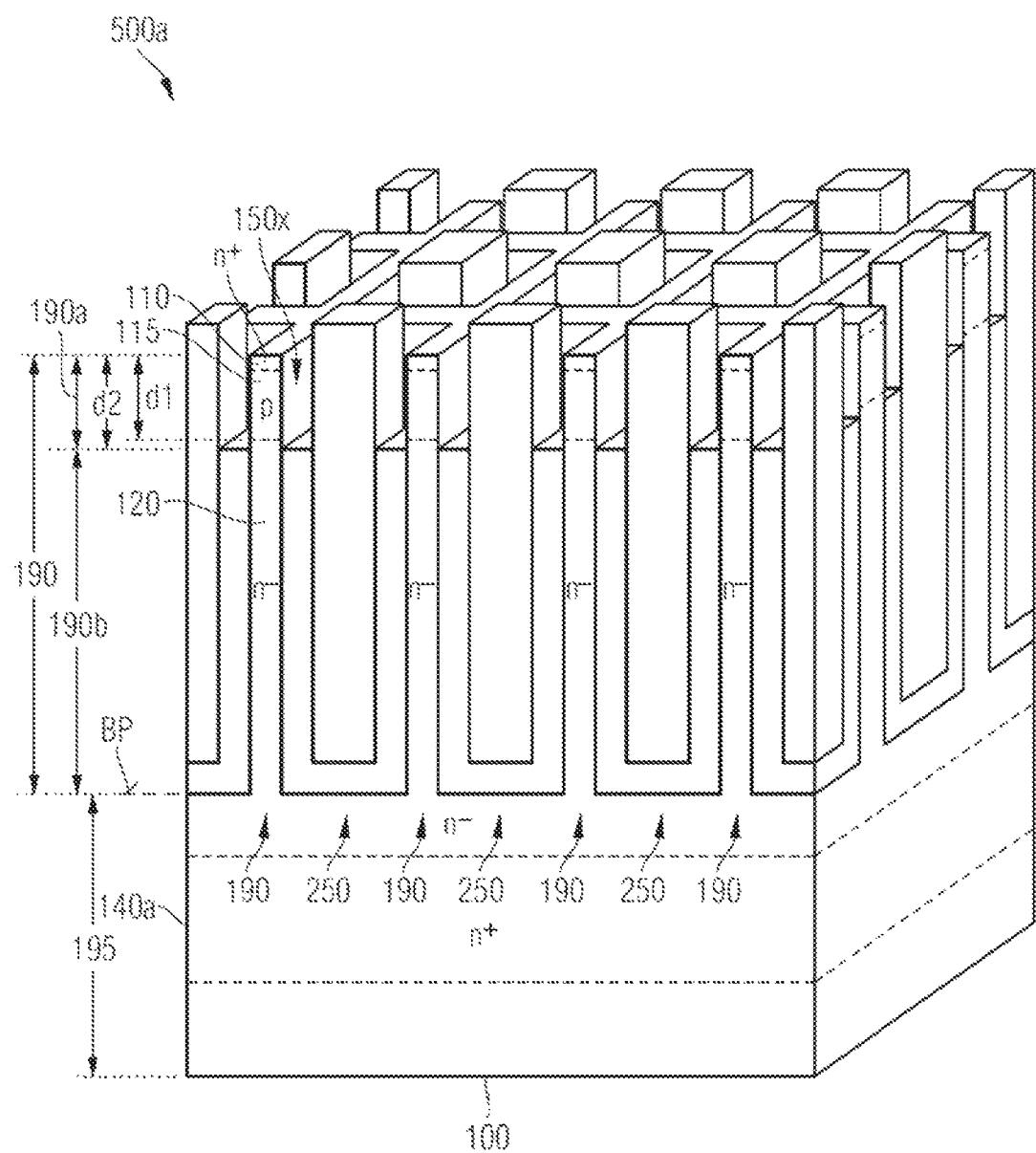
FIG. 5 shows a schematic perspective illustration of the semiconductor substrate portion from FIG. 4 after the process of removing upper portions of the dielectric layer.

FIG. 5 shows the freed upper portions 190a of the semiconductor fins 190. In the semiconductor fins 190, source regions 110 that emerge from the first doping process are formed along the first surface 101a. Channel/body regions 115 have emerged from the second doping process. The remaining lower portions 190b of the semiconductor fins 190 form portions of a drift zone 120 and can have the initial background doping of the semiconductor layer 100a. In accordance with one embodiment, the dopant concentration in the drift zone 120 initially slightly decreases proceeding from the base plane BP in the direction of the first surface 101a and then increases greatly again in the direction of channel/body regions 115. The second doping process can partly or completely oppositely dope the relevant portion of the semiconductor fins 190 and determines the threshold voltage of the transistor cell TC which is assigned to the respective semiconductor fin 190 in the finalized semiconductor component.

A distance d2 between the first surface 101a and the lower edge of gate trenches 150x produced by the removal of the upper portions of the dielectric layer 251a is at least of the same magnitude as or greater than a distance d1 between the first surface 101a and the transitions between the channel/body regions 115, on the one hand, and the drift zone 120, on the other hand.

According to one embodiment, the upper portions 190a of the semiconductor fins 190 can be thinned. By way of example, an isotropic wet or dry etch thins the exposed upper portions 190a of the semiconductor fins 190. The etch can have a high etching selectivity with respect to the field dielectric 251 or can be non-selective with respect to this material. In accordance with other embodiments, the thinning of the upper portions 190a of the semiconductor fins 190 is omitted.

Figure 6B:
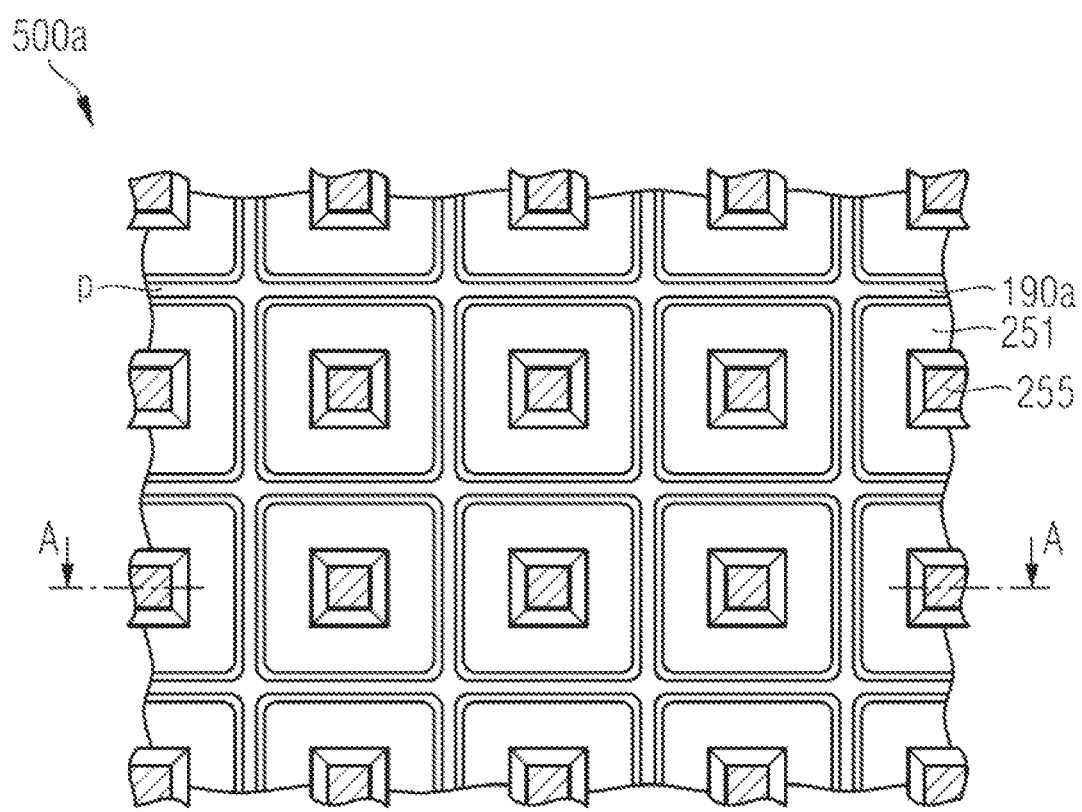
FIG. 6B shows a schematic lateral cross section of the semiconductor substrate portion from FIG. 6A along the sectional line B-B parallel to the main surface.

FIG. 6A and 6B show the thinned upper portions 190a of the semiconductor fins 190 with the source regions 110 and the channel/body regions 115. The lower edges of the gate trenches 150x can be rounded by an isotropic and/or non-selective etch.

On the front side of the component, a further dielectric layer 151x can be produced at least on the exposed surfaces of the semiconductor fins 190. The production of the further dielectric layer 151x can comprise a thermal oxidation of the semiconductor material and/or the deposition of one or a plurality of dielectric materials. By way of example, on the front side of the semiconductor substrates 500a, a silicon oxide based on TEOS is deposited with a layer thickness of at least 10 and at most 100 nm.

Figure 7A:
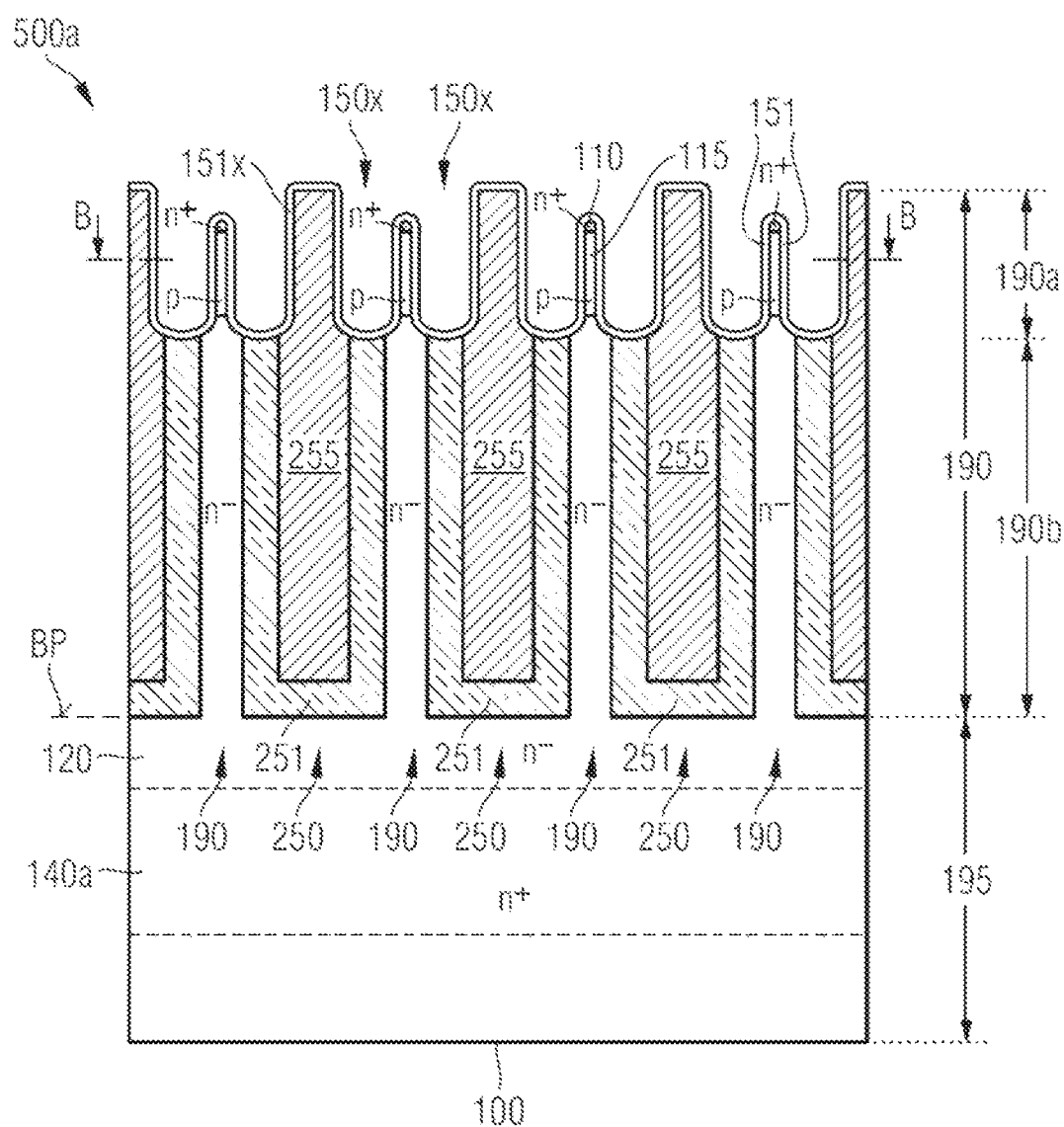
FIG. 7A shows a schematic vertical cross section of the semiconductor substrate portion from FIG. 6A after the process of forming a gate dielectric.
Figure 7B:
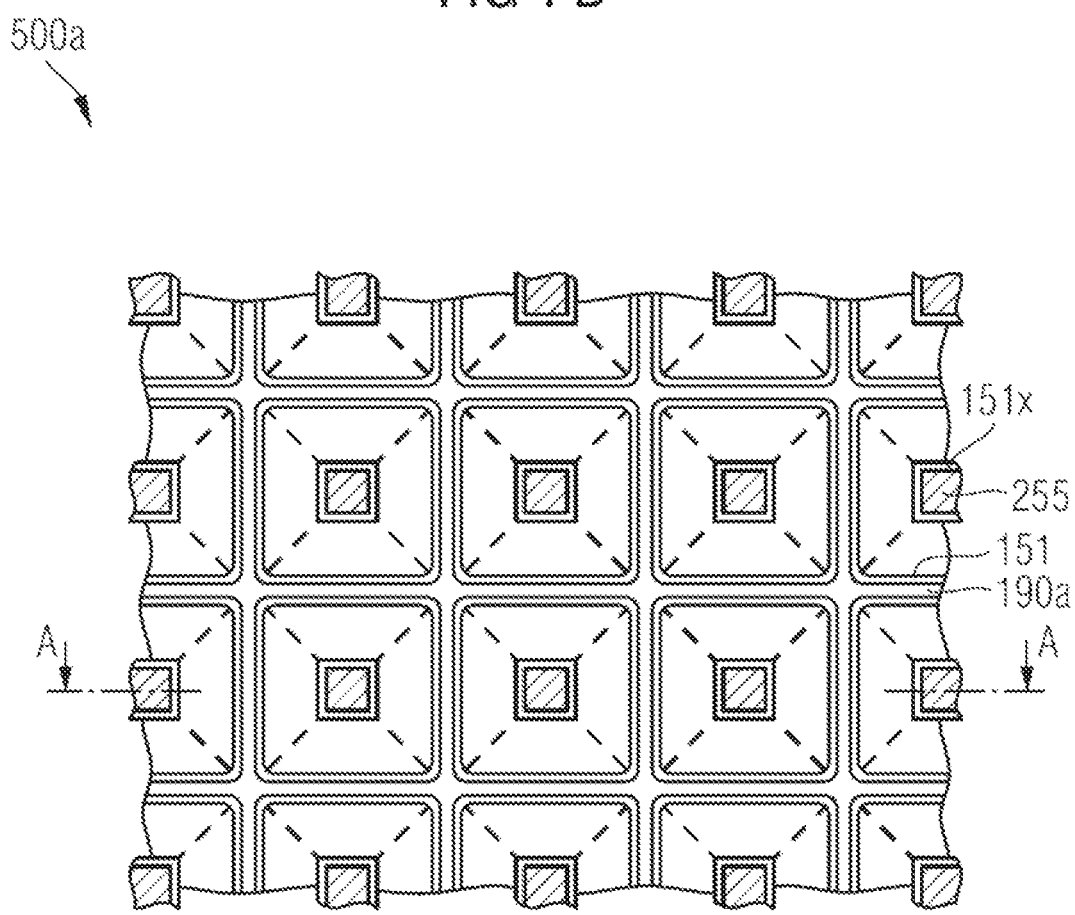
FIG. 7B shows a schematic lateral cross section of the semiconductor substrate portion in FIG. 7A along the sectional line B-B.

FIGS. 7A and 7B show the deposited further dielectric layer 151x, which covers the relief on the front side with uniform layer thickness. Portions of the further dielectric layer 151x along the channel/body regions 115 form a gate dielectric 151. Further portions of the further dielectric layer 151x can cover the field electrodes. In accordance with another embodiment, the further dielectric layer 151x is produced only on silicon, for example by thermal oxidation. For embodiments directed to the production of JFET transistor cells, the production of the further dielectric layer 151x is omitted.

A conductive gate electrode material is deposited, the gate trenches 150x being filled. By way of example, highly doped polycrystalline silicon is deposited from the front side.

Figure 8A:
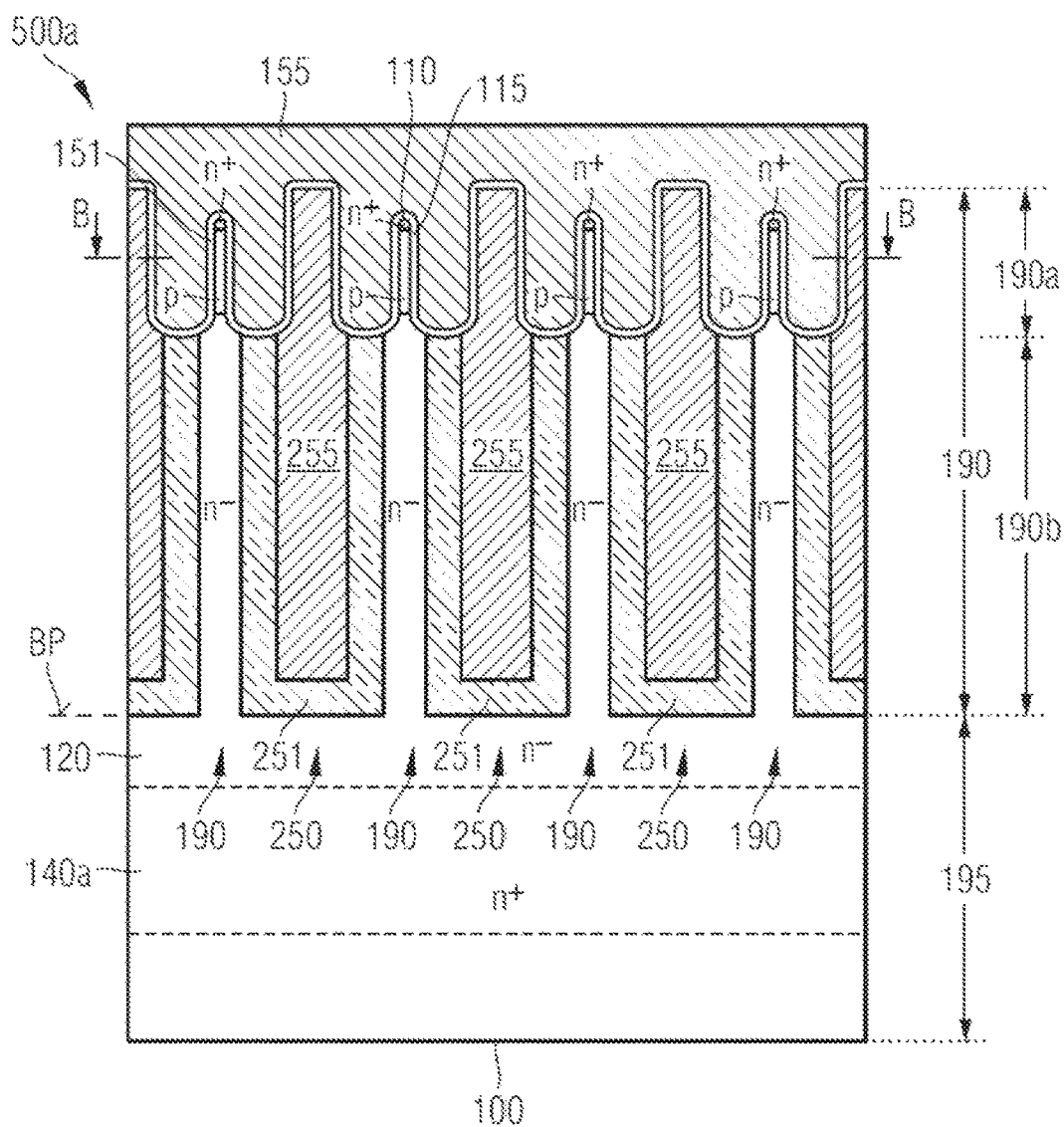
FIG. 8A shows a schematic vertical cross section of the semiconductor substrate portion from FIG. 7A after the process of forming a gate electrode.
Figure 8B:
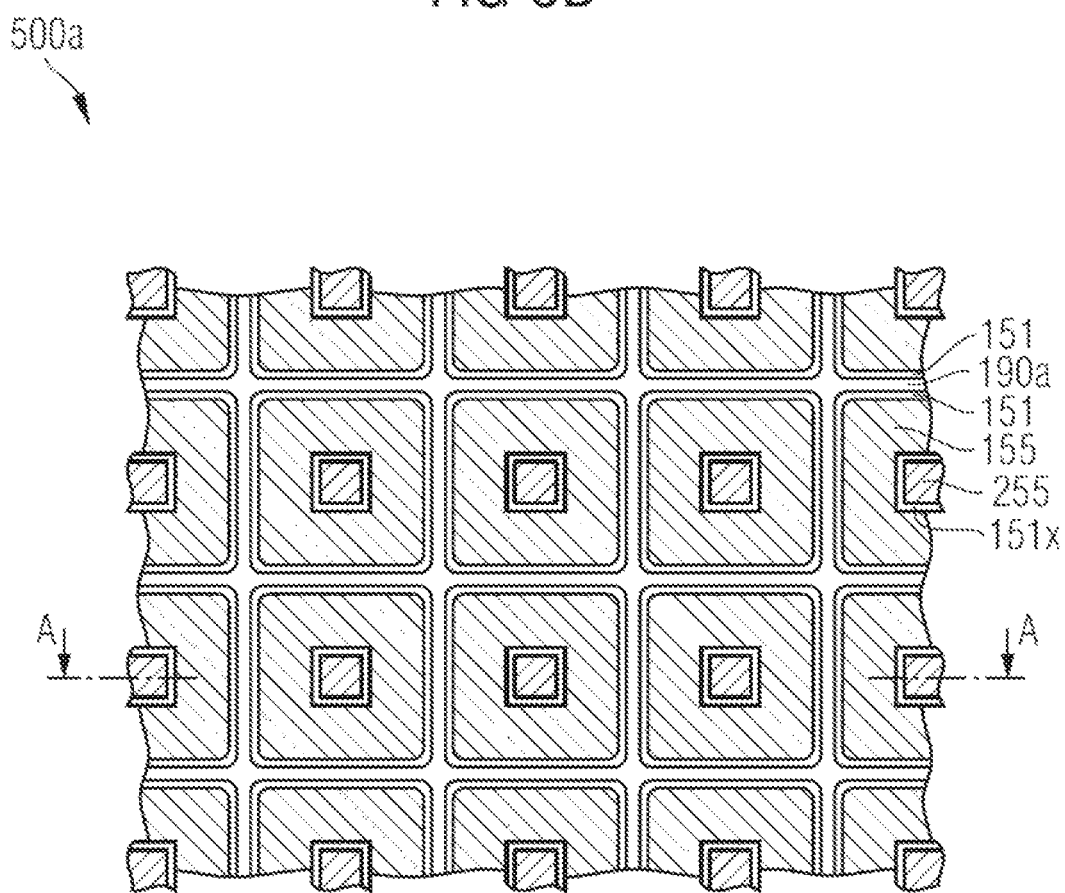
FIG. 8B shows a schematic lateral cross section of the semiconductor substrate portion from FIG. 8A along the sectional line B-B.

FIGS. 8A and 8B show the deposited gate electrode material. Portions of the gate electrode material in the gate trenches 150x form mutually separated first portions of a gate electrode 155 which are formed in each case in pairs on mutually opposite sides of a channel/body region 115 situated therebetween. Portions of the gate electrode material outside the gate trenches 150x form a second portion of the gate electrode 155 that connects the first portions of the gate electrode 155.

A dielectric structure can be produced on the gate electrode 155, for example by the deposition of one or a plurality of dielectric materials. By means of a photolithographic method, in the dielectric structure 220, first contact openings to the semiconductor fins 190 are formed and second contact openings are formed in the vertical projection of the field electrodes 255. By means of conformal deposition and subsequent anisotropic etching of a dielectric auxiliary layer, for example, dielectric spacers 222 are formed along the sidewalls of the contact openings. For the formation of contact structures in the first and second contact openings and of load electrodes, one or a plurality of metal-containing materials are deposited from the front side. A plurality of identical semiconductor components in accordance with FIGS. 1A to 1D emerge from the semiconductor substrate 500a by means of singulation.

Figure 9B:
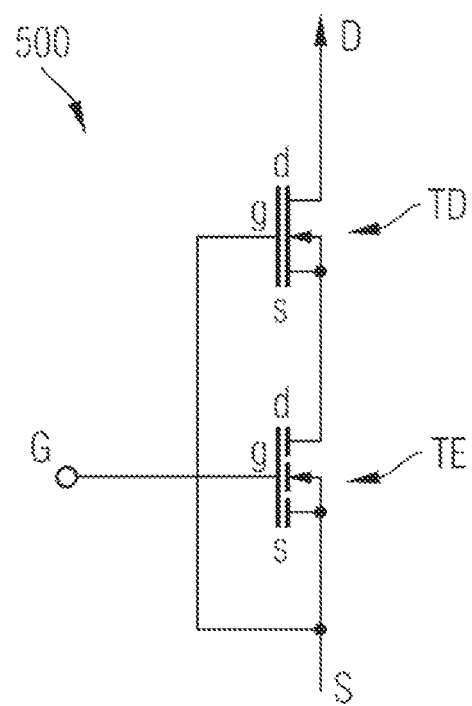
FIG. 9B shows a schematic circuit diagram of an ADZFET in accordance with FIG. 9A.

The semiconductor component 500 in FIGS. 9A and 9B relates to an ADZFET having a first enhancement-mode transistor TE and at least one second depletion-mode transistor TD. The transistors TE, TD in each case comprise transistor cells TC in accordance with FIG. 1A. In the exemplary embodiment depicted, the two transistors TE, TD are n-channel IGFETs, wherein the channel/body regions 115x of the first transistor TE are of the p-type and the channel/body regions 115y of the second transistor TD are of the n-type.

The connection layers 140x, 140y of the two transistors TE, TD are separated from one another, for example by dielectric structures, intrinsic semiconductor structures or active separating structures. The first load electrode 310x of the first transistor TE forms a source terminal S or is electrically connected to the source terminal S. The first load electrode 310y of the second transistor TD is simultaneously the second load electrode of the first transistor TE and is electrically connected via a transistor connection 391 to the connection layer 140x of the first transistor TE. The transistor connection 391 can comprise a deep contact composed of a metal-containing material or highly doped polycrystalline silicon material or a highly doped column extending from the main surface 101 at least as far as or into the first connection layer 140x.

The gate electrode 155x of the first transistor TE is electrically conductively connected to a gate terminal G. The gate electrode 155y of the second transistor TD is electrically connected to the source terminal S. The second connection layer 140y of the second transistor TD is electrically connected to a drain terminal D. The semiconductor component 500 can comprise further second depletion-mode transistors which are electrically connected among one another and to the second transistor TD in the same way as the second transistor TD is electrically connected to the first transistor TE.

The two transistors TE, TD are configured to form a cascade circuit as shown in FIG. 9B. In the conductive or switched-on state of the semiconductor component 500, a positive potential applied to the gate terminal G induces an electron channel through the channel/body regions 115x of the first transistor TE, whereby the source potential applied to the source terminal is switched to the first connection layer 140x and via the transistor connection 391 to the source regions 110y of the second transistor TD. At the same time, the same source potential is led to the second gate electrodes 155y of the second transistor TD. If the same potential is present at the gate electrodes 155y and at the source regions 110y of the second transistor TD, then the second transistor TD is conductive or switched on, such that the semiconductor component 500 switches the potential applied to the source terminal S through to the drain terminal D.

If the potential at the gate terminal G falls below the threshold voltage of the first transistors TE, then the latter turns off and the first connection layer 140x and the source regions 110y of the second transistors TD are pulled to a positive potential via the still turned-on second transistors TD via the components connected to the drain terminal D. By contrast, the negative gate-source potential is still present at the second gate electrodes 155y of the second transistor TD, such that, given a sufficiently high drain voltage, the gate potential of the second transistor TD falls below the threshold voltage thereof and the second transistor TD likewise turns off. The channel/body regions 115y in the second transistor TD are depleted, the mobile negative charge carriers (electrons) flowing away from the second channel/body regions 115y.

The positively charged stationary atomic cores of the dopant atoms remain in the second channel/body regions 115y. The negatively biased field electrodes 250 can compensate for the remaining positive charge in the drift regions in the semiconductor fins 190, such that the second transistor TD has a comparatively high reverse voltage even at relatively high dopant concentrations in the second drift regions in the semiconductor fins 190. At the same time, the high dopant concentration reduces the on resistance and the static losses of the semiconductor component 500. The reverse voltage of the semiconductor component 500 can be set by way of the number of depletion-mode transistors TD that are connected in a cascade configuration between the first transistor TE and the drain terminal D. Comparatively expensive and time-intensive removal processes for thinning a semiconductor component to a component thickness adapted to the reverse voltage are avoided as a result. The channel/body regions 115x, 115y are connected to the respective load electrode 310x, 310y via highly doped contact zones that alternate with the source regions 110 in at least one lateral direction.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component, comprising:
   semiconductor fins formed between a base plane and a main surface of a semiconductor body, each semiconductor fin comprising a source region formed between the main surface and a channel/body region and a drift zone formed between the channel/body region and the base plane;
   gate electrode structures on two mutually opposite sides of each channel/body region;
   a field electrode structure between mutually adjacent ones of the semiconductor fins, each field electrode structure being separated from the drift zones by a field dielectric and extending from the main surface as far as the base plane, wherein the gate electrode structures assigned to the mutually adjacent semiconductor fins enclose an upper portion of the corresponding field electrode structure from at least two sides;
   a buried connection layer having a net dopant concentration of at least $1E18$ cm$^{-3}$ between the base plane and a rear-side surface opposite the main surface; and
   a transistor connection connected to the connection layer and comprising a contact or a highly doped column extending from the main surface as far as the connection layer.

2. The semiconductor component of claim 1, wherein the field electrode structures in each case extend at least over half of a distance between the channel/body region and the base plane.

3. The semiconductor component of claim 1, wherein upper portions of the semiconductor fins between the main surface and a transition between the channel/body regions and the drift zones are narrower than lower portions between the upper portions and the base plane.

4. The semiconductor component of claim 3, wherein sidewalls of the semiconductor fins at least in the upper portions are {111} crystal faces of a silicon crystal.

5. The semiconductor component of claim 1, wherein the semiconductor fins extend along a first lateral direction.

6. The semiconductor component of claim 1, wherein first semiconductor fins extend along a first lateral direction and second semiconductor fins extend along a second lateral direction, which intersects the first lateral direction, and in each case two first and two second semiconductor fins are connected at a fin node.

7. The semiconductor component of claim 1, wherein first semiconductor fins extend along a first lateral direction and second semiconductor fins extend along a second lateral direction, which intersects the first lateral direction, and in each case two first semiconductor fins and one second semiconductor fin are connected at a fin node.

8. The semiconductor component of claim 1, further comprising: first contact structures which extend from the main surface as far as at least the source regions.

9. The semiconductor component of claim 1, wherein the field dielectric extends from the gate electrode structure as far as the base plane.

10. The semiconductor component of claim 1, wherein the gate electrode structures have a gate electrode and a gate dielectric separating the gate electrode from the respective channel/body region.

* * * * *